United States Patent [19]
Park

[11] Patent Number: 6,078,086
[45] Date of Patent: Jun. 20, 2000

[54] METAL OXIDE SEMICONDUCTOR FIELD EFFECT TRANSISTOR AND METHOD OF MANUFACTURING THE SAME

[75] Inventor: Soon Duk Park, Kyungsan-si, Rep. of Korea

[73] Assignee: LG Semicon Co., Ltd., Chungcheongbuk-Do, Rep. of Korea

[21] Appl. No.: 09/053,132

[22] Filed: Apr. 1, 1998

Related U.S. Application Data

[62] Division of application No. 08/857,267, May 16, 1997, Pat. No. 5,811,340.

[30] Foreign Application Priority Data

Oct. 25, 1996 [KR] Rep. of Korea .................. 96-48258

[51] Int. Cl.⁷ .................................................. H01L 29/76
[52] U.S. Cl. .......................... 257/386; 257/389; 257/408
[58] Field of Search .................................. 257/336, 344, 257/408, 389, 406, 410, 411, 386, 900

[56] References Cited

U.S. PATENT DOCUMENTS

| | | | |
|---|---|---|---|
| 5,015,598 | 5/1991 | Verhaar | 438/304 |
| 5,270,226 | 12/1993 | Hori et al. | |
| 5,270,227 | 12/1993 | Kameyama et al. | |
| 5,314,834 | 5/1994 | Mazure et al. | 438/301 |
| 5,349,225 | 9/1994 | Redwine et al. | 257/336 |
| 5,422,506 | 6/1995 | Zamapian | 257/344 |
| 5,426,063 | 6/1995 | Kaneko et al. | |
| 5,434,093 | 7/1995 | Chau et al. | |
| 5,436,482 | 7/1995 | Ogoh | 257/344 |
| 5,466,957 | 11/1995 | Yuki et al. | 257/344 |
| 5,472,894 | 12/1995 | Hsu et al. | 438/282 |
| 5,538,913 | 7/1996 | Hong | |
| 5,567,965 | 10/1996 | Kim | 257/336 |
| 5,580,799 | 12/1996 | Funaki | |
| 5,597,752 | 1/1997 | Niwa | |
| 5,773,863 | 6/1998 | Burr et al. | 257/344 |
| 5,780,902 | 7/1998 | Komuro | 257/344 |

*Primary Examiner*—Mahshid Saadat
*Assistant Examiner*—George C. Eckert, II
*Attorney, Agent, or Firm*—Morgan, Lewis & Bockius LLP

[57] ABSTRACT

A MOSFET includes a semiconductor substrate of a first conductivity type including a field region and an active region; a gate insulating film on a portion of the active region, the gate insulating film having two edge parts and a mid-part, the two edge parts being thicker than the mid-part; a gate electrode on the gate insulating film; sidewall spacers on the sides of the gate electrode and the gate insulating film; heavily doped regions of a second conductivity type in the semiconductor substrate under the two edge parts of the gate insulating film; normally doped regions of the second conductivity type in the semiconductor substrate on both sides of the gate insulating film; lightly doped regions of the second conductivity type in the semiconductor substrate on the sides of the sidewall spacers; and doped regions of the first conductivity type below the normally doped region of the second conductivity type under the sidewall spacers.

10 Claims, 8 Drawing Sheets

METAL OXIDE SEMICONDUCTOR FIELD EFFECT TRANSISTOR AND METHOD OF MANUFACTURING THE SAME

This is a divisional of copending application application Ser. No. 08/857,267 filed on May 16, 1997, U.S. Pat. No. 5,811,340.

This application claims the benefit of Korean Application No. 48258/1996, filed Oct. 25, 1996, which is hereby incorporated by reference.

BACKGROUND OF THE INVENTION

1. Field of the Invention

The present invention relates to a metal oxide semiconductor field effect transistor (MOSFET), and more particularly, to a MOSFET and a method of manufacturing the same which is suitable to elevate the current drivability and to improve short channel effects.

2. Discussion of the Related Art

Metal oxide semiconductor (MOS) technology was invented by Fairchild in 1958. It is an innovatory technology for improving the transistor characteristics. The corresponding manufacturing method includes the step of growing a high quality insulating silicon oxide film on the surface of a silicon semiconductor. The invention of the MOS technology accelerated the application of semiconductor-surface devices. As a result, a field effect transistor (FET) was first presented by Texas Instruments in 1962.

MOSFET devices are categorized into p-MOS, n-MOS and CMOS devices. A p-MOS device with easily controllable power consumption and manufacturing process was initially utilized. As the speed of the device becomes more important, an n-MOS device was used because it utilizes electrons with a speed 2.5 times faster than that of holes. A CMOS device has a low power consumption, a complicated manufacturing process, and a low packing density as compared to the p-MOS and n-MOS devices. Presently, a memory part of a device is formed from the n-MOS device, and a periphery circuit part is formed from the CMOS device.

These MOS devices are manufactured by decreasing a channel length for high integration and high speed. Due to the short channel length, a drain depletion region increases and interacts with a channel junction, thereby causing drain induced barrier lowering (DIBL). Further, a leakage current increases because of the punchthrough between the two depletion regions caused by the severe encroachment of the source and drain depletion regions. In addition, as the distance between the source and drain regions decreases, electrons injected from the source region are rapidly accelerated by the high electric field near the pinch-off region of the drain junction, thereby causing hot carrier effects.

The hot carriers are then injected into a gate insulating film and flow toward a substrate, thereby generating a large substrate current. Accordingly, a MOS transistor with a lightly doped drain (LDD) structure was suggested since it reduces the hot carrier effect while maintaining the short channel length.

The LDD structure is a structure in which a self-aligned lightly doped region is located between the channel region and the high concentration impurity region (source/drain regions). The lightly doped region spreads out the high electric field nearby the drain junction so that carriers injected from the source region are not accelerated even though a high voltage is applied, thereby overcoming the instability of current due to the hot carriers.

A method of manufacturing a conventional MOSFET will now be described with reference to FIGS. 1A–1C.

Figure 1A:
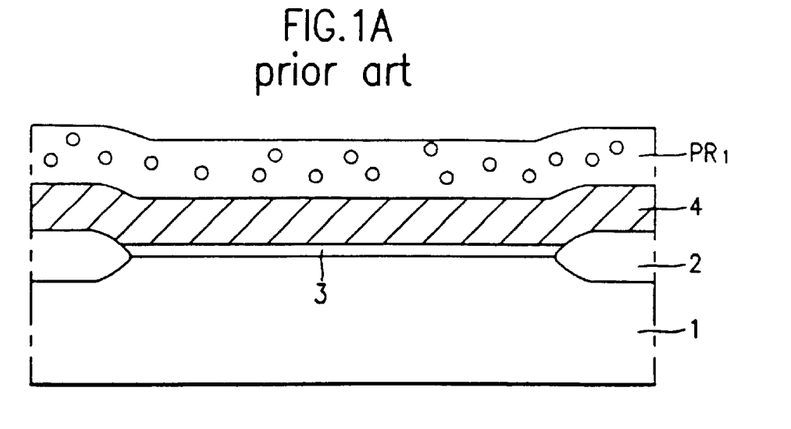
FIGS. 1A–1C are cross-sectional views illustrating a method of manufacturing the conventional MOSFET.

As shown in FIG. 1A, on a semiconductor substrate 1 with a field region and an active region defined, a field oxidation process is performed selectively to form a field oxide film 2 in the field region. Then, a gate oxide film 3, a polysilicon film 4 and a photoresist film ($PR_1$) are sequentially formed on the active region of the semiconductor substrate 1.

Figure 1B:
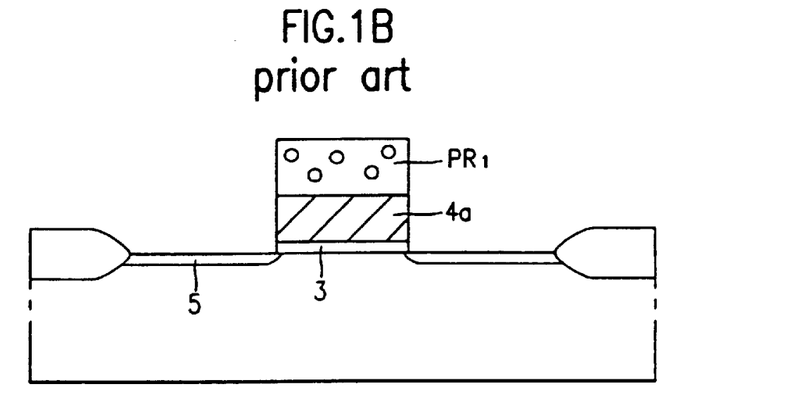

As shown in FIG. 1B, the photoresist film ($PR_1$) is patterned through exposure and development processes to define a region where a gate electrode is to be formed. Then, using the patterned photoresist film ($PR_1$) as a mask, the polysilicon film 4 and the gate oxide film 3 are sequentially etched to form a gate electrode 4a. Then, using the gate electrode 4a as the mask, impurity ions with a low concentration are implanted into the substrate on both sides of the gate electrode 4a, thereby forming lightly doped drain (LDD) regions 5.

Figure 1C:
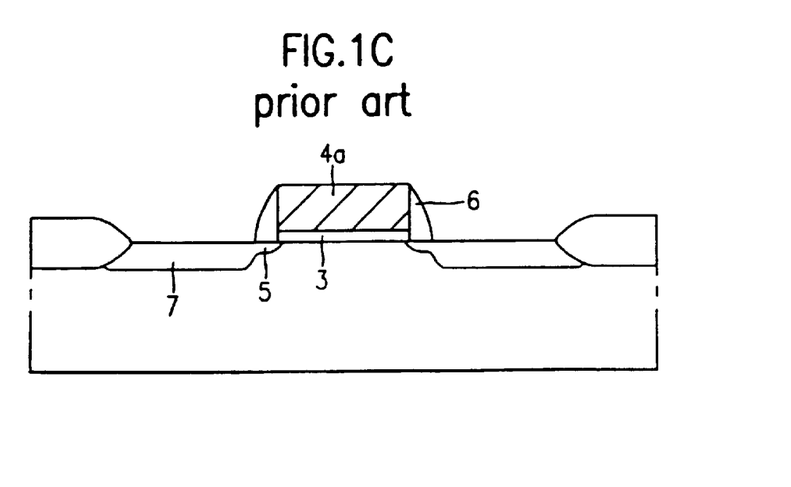

As shown in FIG. 1C, the photoresist film ($PR_1$) is removed. Then, an oxide film is formed on the entire surface of the substrate including the gate electrode 4a and etched back to form sidewall spacers 6 on both sides of the gate electrode 4a. Then, using the gate electrode 4a and the sidewall spacers 6 as a mask, impurity ions with a high concentration are implanted into the semiconductor substrate 1 and activated to form high concentration source and drain regions 7.

The conventional MOSFET has the following problems.

First, the conventional MOSFET with the LDD structure forms the lightly doped region between the high concentration impurity region and the gate electrode in order to reduce the electric field near the drain region. This prevents the hot carrier effects to a certain extent. However, since the gate oxide film under the gate electrode is very thin, electric field is generated in the drain region where it interfaces with the gate oxide film. Thus, the generation of carrier trapping in the gate oxide film occurs. Particularly, due to the negative slope caused when the underlying etch-target layer is formed, the gate oxide layer is over-etched to cause the carrier trapping. As a result, the lifetime of the device is reduced.

Secondly, a parasitic capacitance is generated due to the overlap between the gate electrode and the LDD region, thereby decreasing the device speed. Since the current drivability is deteriorated, it is difficult to produce the MOSFET required by the high speed operation.

SUMMARY OF THE INVENTION

Accordingly, the present invention is directed to a MOSFET and a method of manufacturing the same that substantially obviates one or more of the problems due to limitations and disadvantages of the related art.

An object of the present invention is to provide a MOSFET and a method of manufacturing the same in which the thickness of the edge of a gate insulating film is thick to prevent the short channel effects through the hot carriers, and the structure of an LDD region is changed to make the high speed operation possible.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, a MOSFET of the present invention includes a semiconductor substrate of a first conductivity type in which a field region and an active region are defined; a gate insulating film formed on a gate electrode formation region of the active region, both edge parts thereof being thicker than the mid-part thereof; a gate electrode formed on the gate insulating film; sidewall spacers formed on the sides of the gate electrode and the gate insulating film; heavily doped regions of a second conductivity type formed in the semiconductor substrate under both edge parts of the gate insulating film; normally doped regions of the second conductivity type formed in the semiconductor substrate on both sides of the gate insulating film; lightly doped regions of the second conductivity type formed in the semiconductor substrate on the sides of the sidewall spacer excluding the gate electrode formation region; and doped regions of the first conductivity type formed below the normally doped region of the second conductivity type under the sidewall spacer.

In another aspect, a method of manufacturing a MOSFET of the present invention includes the steps of preparing a semiconductor substrate of a first conductivity type; selectively forming a field insulating film on the semiconductor substrate; sequentially forming a first insulating film and a second insulating film on the entire surface of the substrate including the field insulating film and defining a gate electrode formation region to selectively remove the second insulating film of the gate electrode formation region, thereby forming a trench exposing the first insulating film; defining the exposed first insulating film into both edge parts and a mid-part; forming a first sidewall spacer on the side of the second insulating film on the edge part of the trench; forming a gate electrode on the first insulating film including the first sidewall spacer; forming a heavily doped region of a second conductivity type in the semiconductor substrate on the side of the mid-part (M) of the first insulating film, through a tilted ion implantation process using the gate electrode as a mask; forming a normally doped region of the second conductivity type in the semiconductor substrate on the side of the gate electrode, through an ion implantation process using the gate electrode as a mask; forming a second sidewall spacer on the sides of the gate electrode and the first sidewall spacer; forming a lightly doped region of the second conductivity type in the semiconductor substrate on the side of the second sidewall spacer, through an ion implantation process using the second sidewall spacer and the gate electrode; and forming a doped region of the first conductivity type below the normally doped region of the second conductivity type under the second sidewall spacer, through a tilted ion implantation process using the second sidewall spacer and the gate electrode as a mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 2:
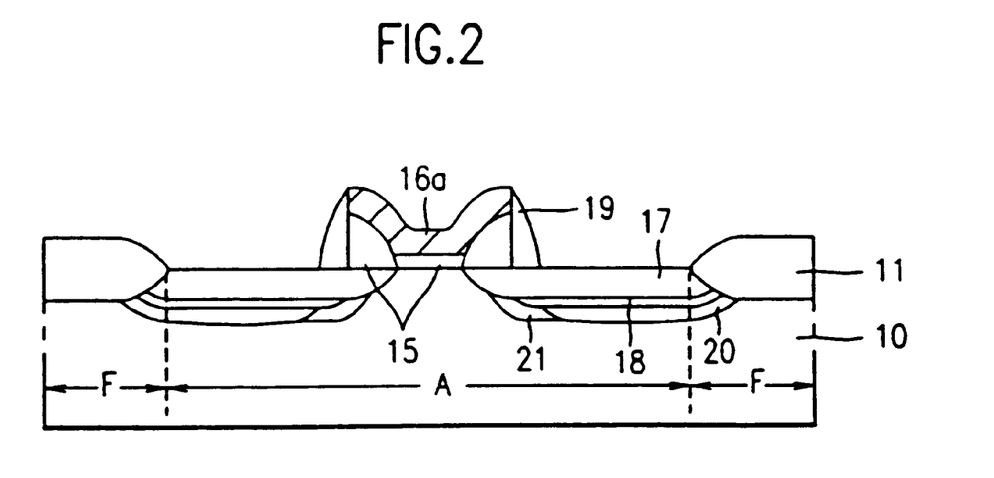
FIG. 2 is a cross-sectional view of a MOSFET structure in accordance with a first embodiment of the present invention.

FIG. 2 is a cross-sectional view of a MOSFET structure in accordance with a first embodiment of the present invention. A semiconductor substrate 10 of a first conductivity type is divided into a field region (F) and an active region (A). A gate insulating film 15 is formed on a predetermined region of the active region (A) where a gate electrode is to be formed. Both edge parts ($E_1,E_2$) of the gate insulating film 15 are thicker than the mid-part of the gate insulating film 15. A gate electrode 16a is formed on the gate insulating film 15. Sidewall spacers 19 are formed on the sides of the gate electrode 16a and the gate insulating film 15. Heavily doped regions 17 of a second conductivity type are formed in the semiconductor substrate 10 under the edge parts ($E_1,E_2$) of the gate insulating film 15. Normally doped regions 18 of the second conductivity type are formed in the semiconductor substrate 10 on both sides of the gate insulating film 15. Lightly doped regions 20 of the second conductivity type are formed in the semiconductor substrate 10 on the sides of the sidewall spacer 19 excluding the gate electrode region. Doped regions 21 of the first conductivity type are formed below the normally doped regions 18 of the second conductivity type under the sidewall spacers 19. Here, the edge parts $E_1$ and $E_2$ of the gate insulating film 15 are formed in a ¼ round shape which is rounded inward toward the gate electrode 16a.

FIGS. 3A–3I are cross-sectional views illustrating a method of manufacturing the MOSFET in accordance with the first embodiment of the present invention.

Figure 3A:
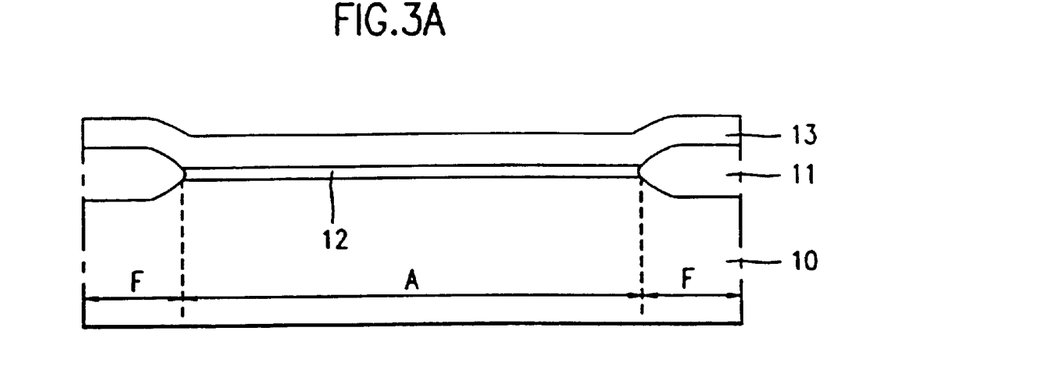
FIGS. 3A–3I are cross-sectional views illustrating a method of manufacturing the MOSFET in accordance with the first embodiment of the present invention.

As shown in FIG. 3A, a field insulating film 11 is formed on a semiconductor substrate 10 of a first conductivity type, and the semiconductor substrate 10 is divided into a field region and an active region. After forming a first insulating film 12 on the active region (A), a second insulating film 13 is formed on the entire surface of the first insulating film 12 including the field insulating film 11. Here, the first insulating film 12 is formed of a silicon-oxynitride. The silicon-oxynitride is formed to a thickness of about 5~10 nm by sequentially performing the oxidation of the semiconductor substrate 10, the nitridation in $N_2O$, and the reoxidation. The second insulating film 13 is formed of either a nitride or an oxide by a chemical vapor deposition method.

Figure 3B:
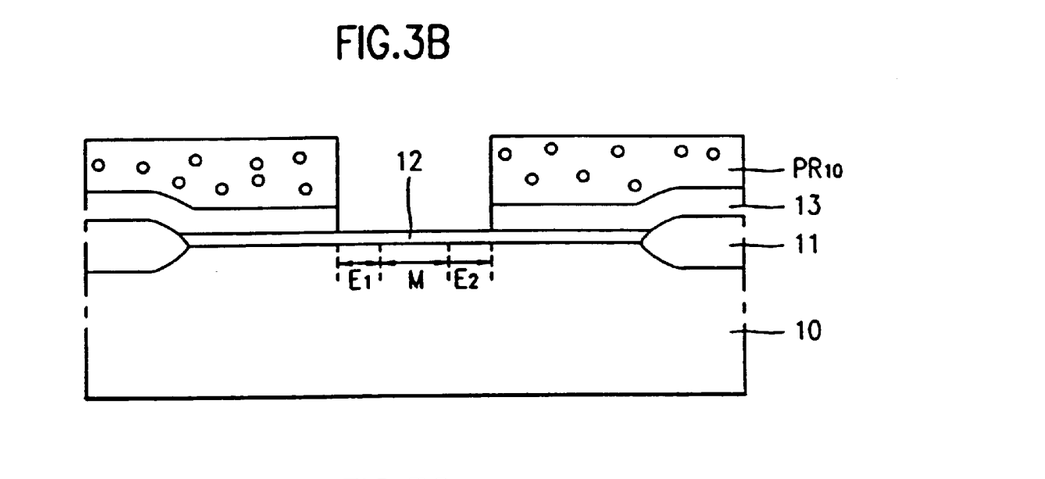

As shown in FIG. 3B, a photoresist film ($PR_{10}$) is formed on the entire surface of the second insulating film 13. Through exposure and development processes, the photoresist film ($PR_{10}$) is patterned to form a region where a gate electrode is to be formed. Then, according to an etching process using the photoresist film ($PR_{10}$) as a mask, the second insulating film 13 on the region where the gate electrode is to be formed is selectively removed to form a trench exposing the upper surface of the first insulating film 12. At this time, the first insulating film 12 exposed within the trench is defined into the edge parts ($E_1, E_2$) and a mid-part (M).

Figure 3C:
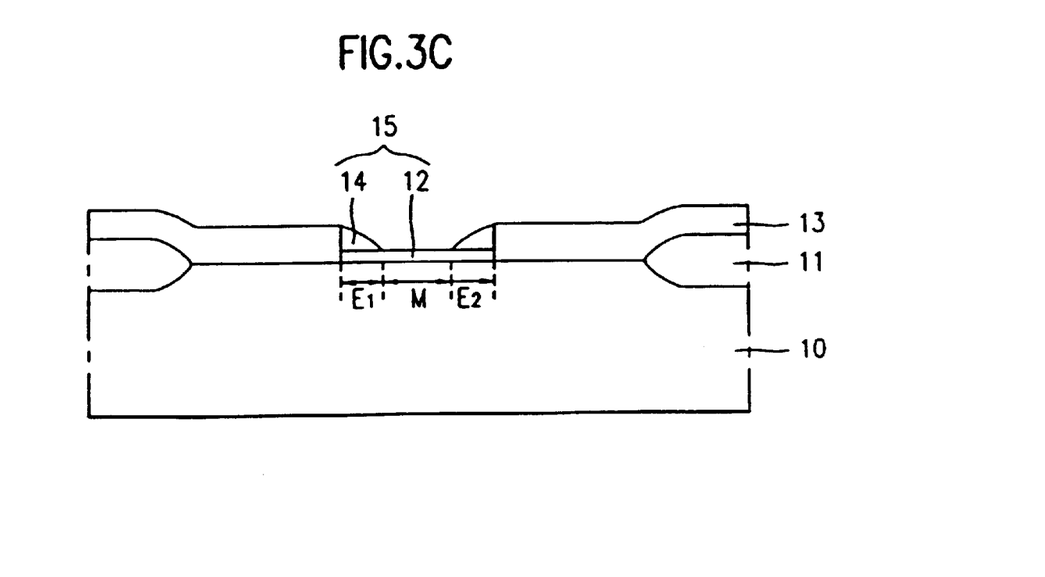

As shown in FIG. 3C, the photoresist film ($PR_{10}$) is removed. Then, an insulating film for forming sidewall spacers is formed on the entire surface of the second insulating film 13 including the exposed first insulating film 12 and etched back, thereby forming first sidewall spacers 14 on the edge parts ($E_1, E_2$) of the exposed first insulating film 12 on both sides of the second insulating film 13. At this time, the first sidewall spacers 14 are formed of either an oxide or a nitride. Together with the first insulating film 12 including the edge parts ($E_1, E_2$) and the mid-part (M), the first sidewall spacers 14 are to be used as a gate insulating film 15. Though not shown, after forming the first sidewall spacers 14, an ion implantation process for preventing punchthrough and an ion implantation process for adjusting a threshold voltage may be carried out.

Figure 3D:
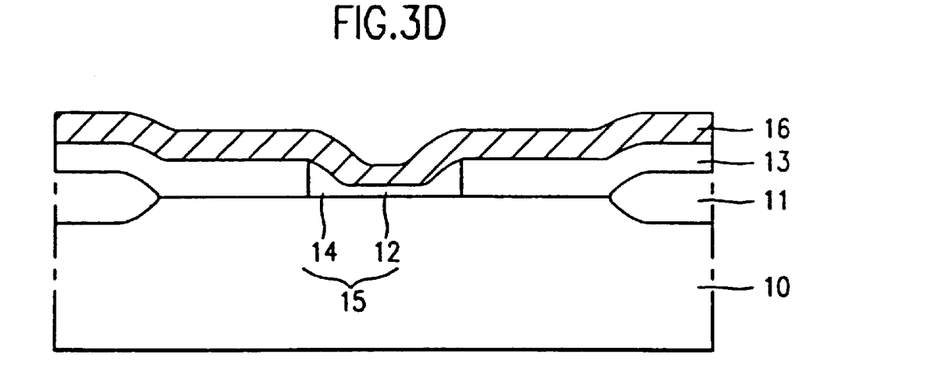

As shown in FIG. 3D, a conductive layer 16 is formed on the entire surface of the second insulating film 13 including the gate insulating film 15. At this time, the conductive layer 16 is formed of a polysilicon, a silicide or a high refractory to metal. If silicide is used, either tungsten (W) or titanium (Ti) is preferable.

Figure 3E:
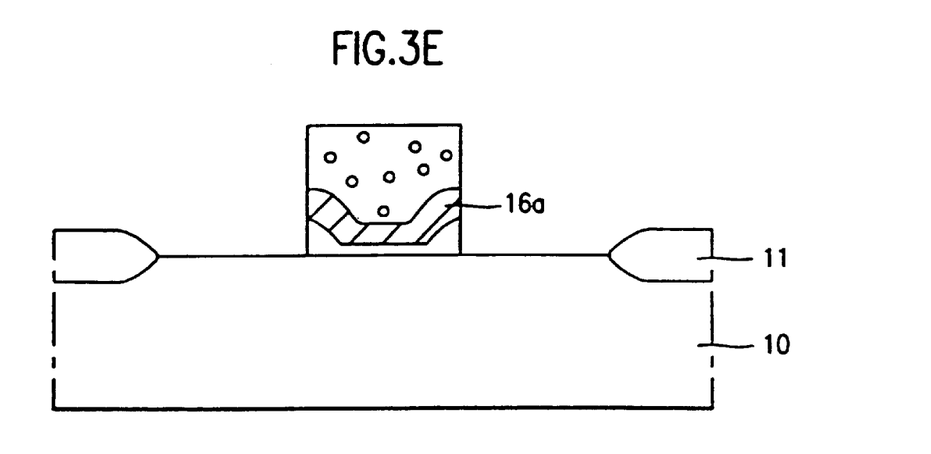

As shown in FIG. 3E, a photoresist film ($PR_{11}$) is formed on the entire surface of the conductive layer 16. Through exposure and development processes, the photoresist film ($PR_{11}$) is patterned to form a region where a gate electrode is to be formed. Then, through an etching process using the patterned photoresist film ($PR_{11}$) as a mask, the conductive layer 16 and the second insulating film 13 on the sides of the gate insulating film 15 are selectively removed. The portion of the conductive layer 16 on the gate insulating film 15 remains, thereby forming a gate electrode 16a.

Figure 3F:
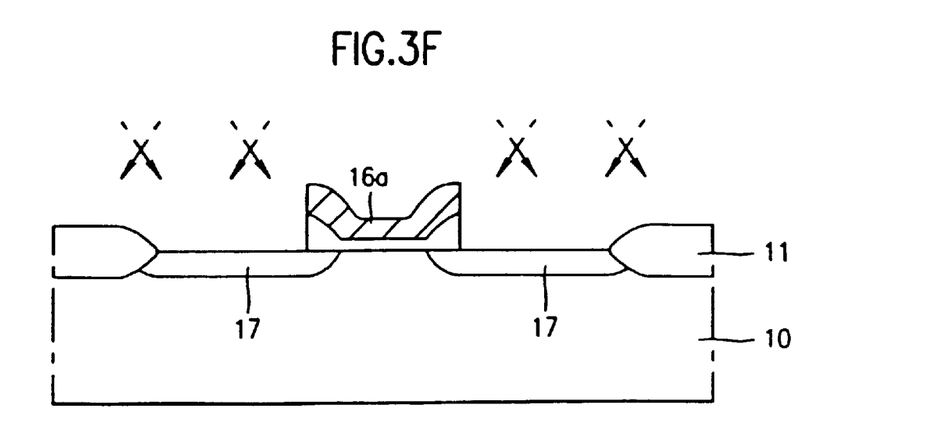

As shown in FIG. 3F, the photoresist film ($PR_{11}$) is removed. Then, through a tilted ion implantation process using the gate electrode 16a as a mask, heavily doped regions 17 of a second conductivity type are formed in the semiconductor substrate 10 on the side of the mid-part (M) of the first insulating film 12. At this time, the degree for the tilted ion implantation may be around 30°~70°.

Figure 3G:
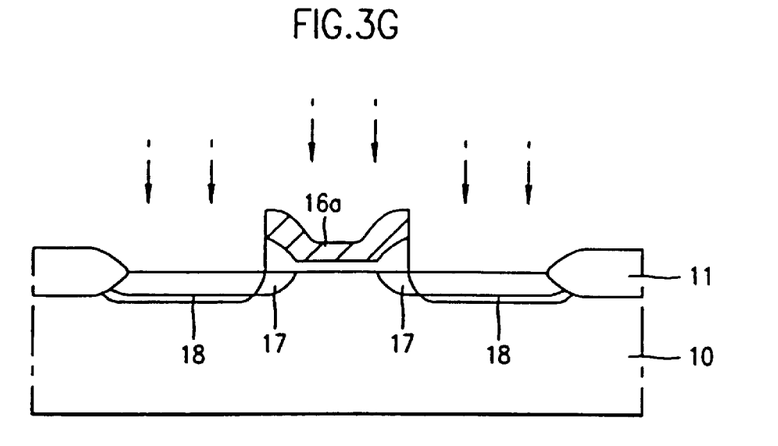

As shown in FIG. 3G, according to a normal ion implantation process using the gate electrode 16a as a mask, normally doped regions 18 of the second conductivity type are formed in the semiconductor substrate 10 on the sides of the gate electrode 16a. At this time, the ion implantation is performed vertically with respect to the substrate.

Figure 3H:
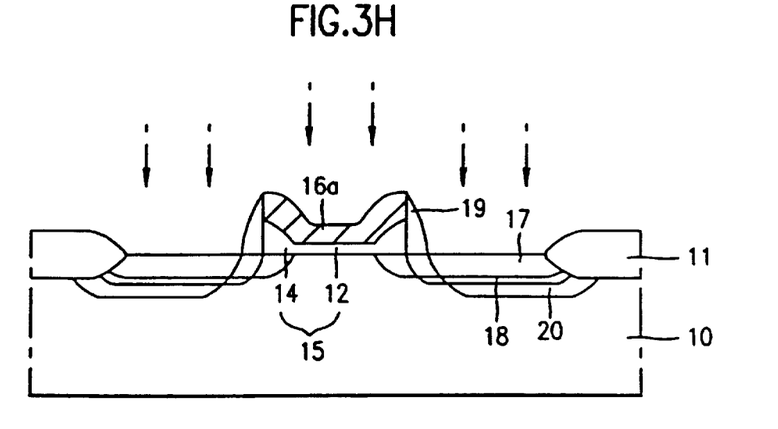

As shown in FIG. 3H, an insulating film for forming sidewall spacer is formed on the entire surface of the semiconductor substrate 10 including the gate electrode 16a and etched back, thereby forming second sidewall spacers 19 on the sides of the gate electrode 16a and the first sidewall spacer 14. Then, through an ion implantation process using the second sidewall spacers 19 and the gate electrode 16a as a mask, lightly doped regions 20 of the second conductivity type are formed in the semiconductor substrate 10 on the sides of the second sidewall spacers 19. At this time, the second sidewall spacers 19 are formed of either an oxide or a nitride. The ion implantation is performed vertically.

Figure 3I:
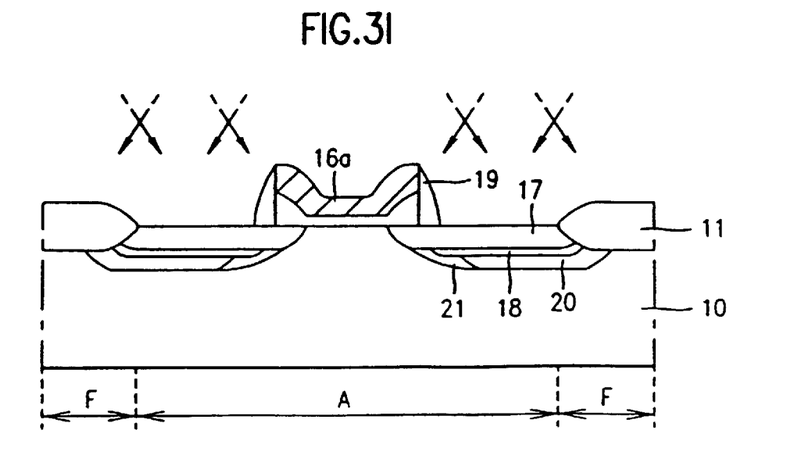

As shown in FIG. 3I, through a tilted ion implantation process using the second sidewall spacers 19 and the gate electrode 16a as a mask, doped regions 21 of the first conductivity type are formed below the normally doped regions 18 of the second conductivity type under the second sidewall spacers 19.

Hereinafter, a MOSFET and a method of manufacturing the same in accordance with a second embodiment of the present invention will be described.

Figure 4:
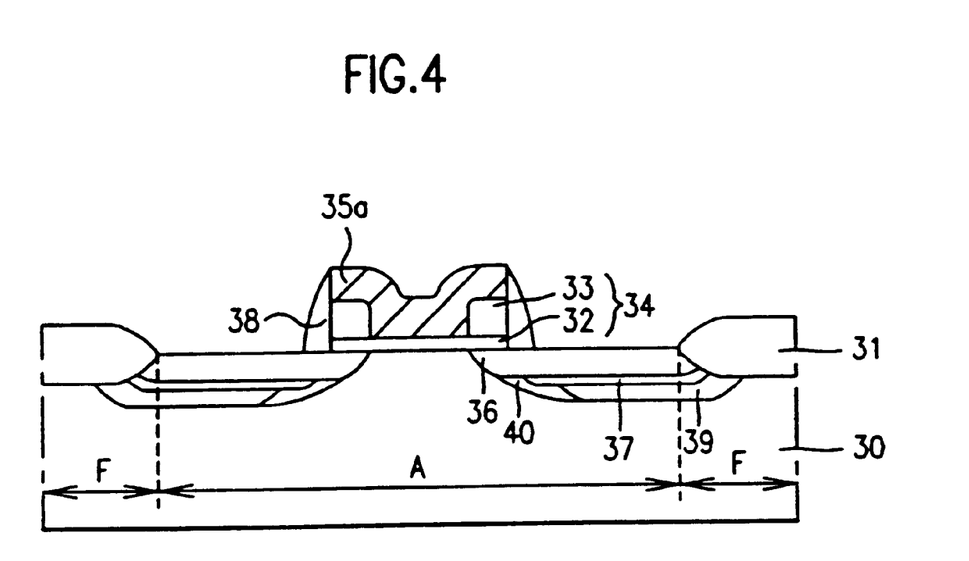
FIG. 4 is a cross-sectional view of a MOSFET structure in accordance with a second embodiment of the present invention.

FIG. 4 is a cross-sectional view of the MOSFET structure in accordance with the second embodiment of the present invention. A semiconductor substrate 30 of a first conductivity type is divided into a field region (F) and an active region (A). A field insulating film 31 is formed on the field region (F) of the semiconductor substrate 30. A gate insulating film 34 is formed on a gate electrode formation region of the active region (A). Both edge parts ($E_1, E_2$) of the gate insulating film 34 is thicker than the mid-part thereof. A gate electrode 35a is formed on the gate insulating film 34. Sidewall spacers 38 are formed on the sides of the gate electrode 35a and the gate insulating film 34. Heavily doped regions 36 of a second conductivity type are formed in the semiconductor substrate 30 excluding the mid-part (M) of the gate insulating film 34. Normally doped regions 37 of the second conductivity type are formed in the semiconductor substrate 30 on both sides of gate insulating film 34. Lightly doped regions 39 of the second conductivity type are formed in the semiconductor substrate 10 on the sides of the sidewall spacer 38 excluding the gate electrode formation region. Doped regions 40 of the first conductivity type are formed below the normally doped regions 37 of the second conductivity type under the sidewall spacers 38. Here, the edge parts $E_1$ and $E_2$ of the gate insulating film 34 are formed with a tetragonal shape.

FIGS. 5A–5H are cross-sectional views illustrating a method of manufacturing the MOSFET in accordance with the second embodiment of the present invention.

Figure 5A:
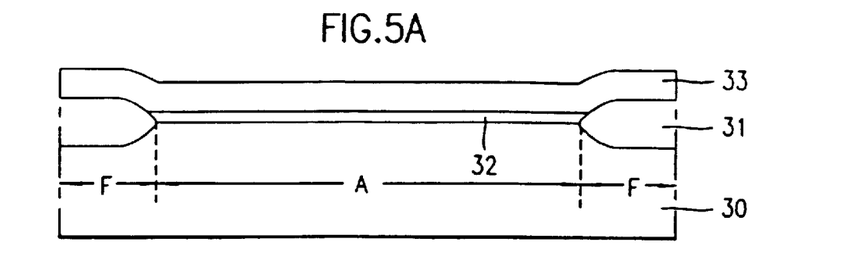
FIGS. 5A–5H are cross-sectional views illustrating a method of manufacturing the MOSFET in accordance with the second embodiment of the present invention.

As shown in FIG. 5A, a field insulating film 31 is formed on a semiconductor substrate 30 of a first conductivity type divided into a field region and an active region. After forming a first insulating film 32 on the active region (A), a second insulating film 33 is formed on the entire surface of the first insulating film 32 including the field insulating film 31. At this time, the first insulating film 32 is formed of a silicon-oxynitride. The silicon-oxynitride is formed to a thickness of about 5~10 nm by sequentially performing the oxidation of the semiconductor substrate 30, the nitridation in $N_2O$, and the reoxidation. The second insulating film 33 is formed of either a nitride or an oxide by a chemical vapor deposition method.

Figure 5B:
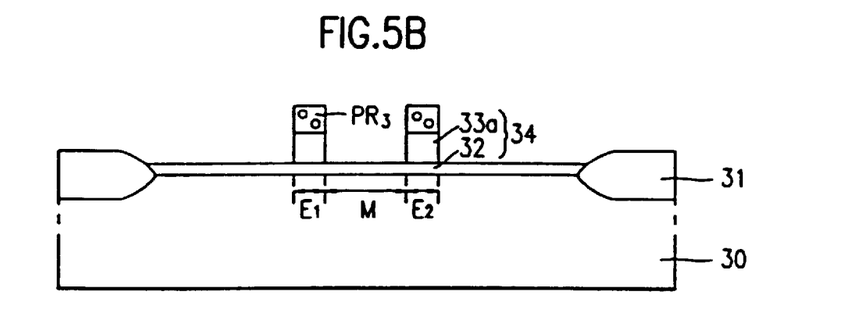

As shown in FIG. 5B, after forming a photoresist film ($PR_3$) on the entire surface of the second insulating film 33, a region where a gate insulating film is to be formed, including both edge parts ($E_1, E_2$) and a mid-part (M), is defined. Through exposure and development processes, the photoresist film ($PR_3$) is selectively removed so that it only remains on the region defined as the edge parts ($E_1, E_2$) of the gate insulating film. Then, through an etching process using the patterned photoresist film ($PR_3$) as a mask, the second insulating film 33 is selectively removed to form a second insulating film patterns 33a of a tetragonal configuration on the edge parts ($E_1, E_2$) of the gate insulating film formation region. Here, the first insulating film 32 and the second insulating film patterns 33a together serve as a gate insulating film 34. Though not shown, after forming the gate insulating film 34, an ion implantation process for preventing punchthrough and an ion implantation process for adjusting a threshold voltage may be carried out.

Figure 5C:
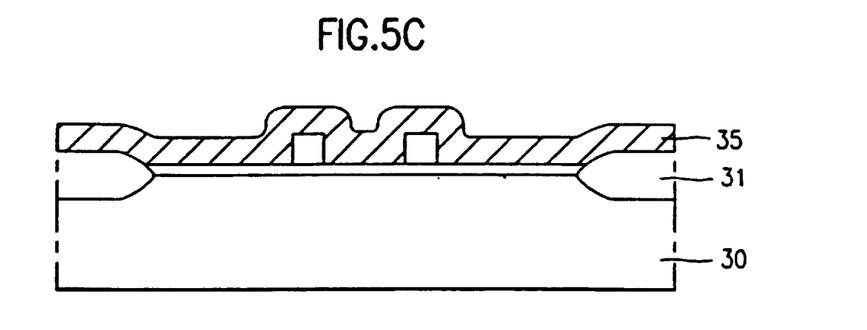

As shown in FIG. 5C, the photoresist film ($PR_3$) is removed. Then, a conductive layer 35 is formed on the entire surface of the first insulating film 32 including the gate insulating film 34. At this time, the conductive layer 35 is formed of a polysilicon, a silicide or a high refractory metal. If silicide is used, either tungsten (W) or titanium (Ti) is preferred.

Figure 5D:
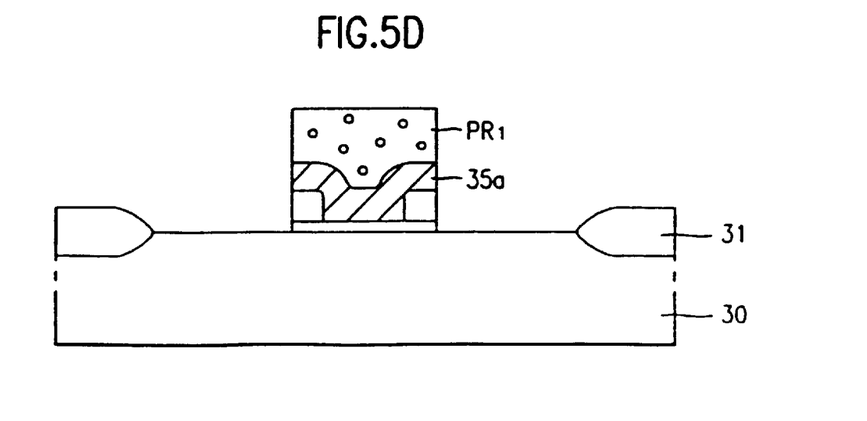

As shown in FIG. 5D, a photoresist film ($PR_1$) is formed on the entire surface of the conductive layer 35. Through exposure and development processes, the photoresist film ($PR_1$) is patterned to define a region where a gate electrode is to be formed. Then, according to an etching process using the patterned photoresist film ($PR_1$) as a mask, the conductive layer 35 is selectively removed to be left only on the gate insulating film 34, thereby forming a gate electrode 35a.

Figure 5E:
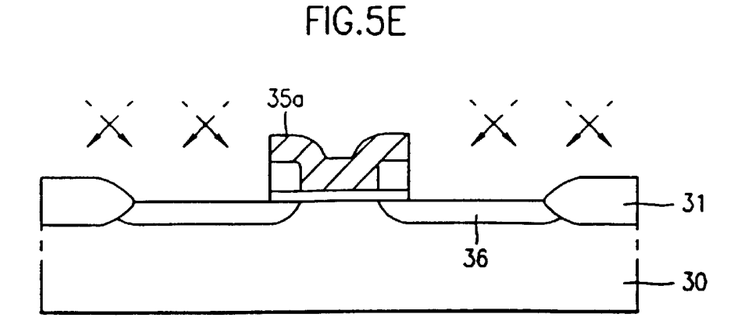

As shown in FIG. 5E, the photoresist film ($PR_1$) is removed. Then, through a tilted ion implantation process using the gate electrode 35a as a mask, heavily doped regions 36 of a second conductivity type are formed in the semiconductor substrate 30 on the side of the mid-part (M) of the first insulating film 32. The degree of the tilted ion implantation may be around 30°~70°.

Figure 5F:
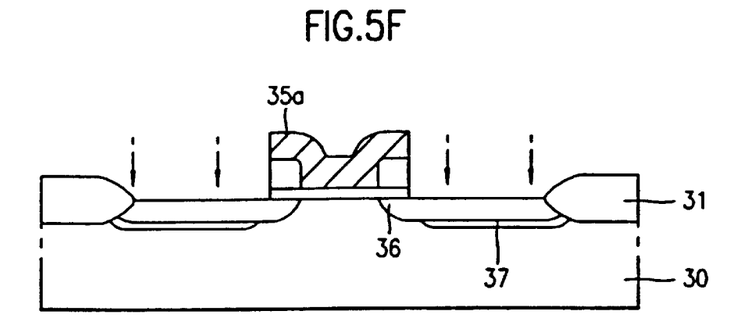

As shown in FIG. 5F, according to a normal ion implantation process using the gate electrode 35a as a mask, normally doped regions 37 of the second conductivity type are formed in the semiconductor substrate 30 on the sides of the gate electrode 35a. At this time, the ion implantation is performed with a vertical degree.

Figure 5G:
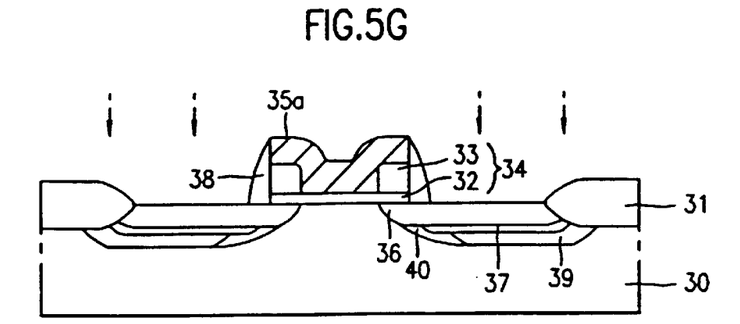

As shown in FIG. 5G, an insulating film for forming sidewall spacers is formed on the entire surface of the semiconductor substrate 30 including the gate electrode 35a and etched back, thereby forming sidewall spacers 38 on the sides of the gate electrode 35a and the second insulating film pattern 33a. Then, through an ion implantation process using the sidewall spacers 38 and the gate electrode 35a as a mask, lightly doped regions 39 of the second conductivity type are formed in the semiconductor substrate 30 on the sides of the sidewall spacers 38. Sidewall spacers 38 are formed of either an oxide or a nitride. The ion implantation is performed with a vertical degree.

Figure 5H:
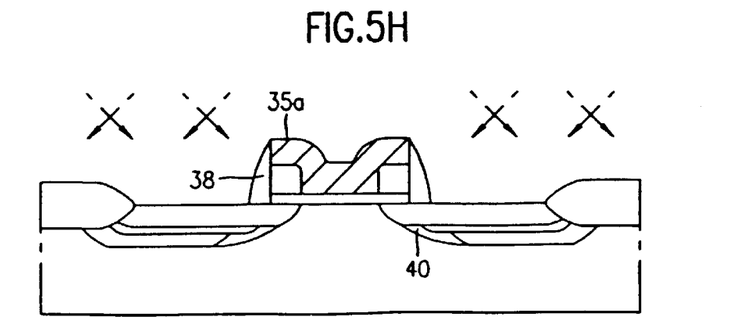

As shown in FIG. 5H, through a tilted ion implantation process using the sidewall spacers 38 and the gate electrode 35a as a mask, doped regions 40 of the first conductivity type with a halo structure are formed below the normally doped regions 37 of the second conductivity type under the sidewall spacers 38, thereby completing the MOSFET in accordance with the second embodiment of the present invention.

The MOSFET of the present invention has the following advantages. First, the gate insulating film consisting of the silicon-oxynitride is formed in the sidewall configuration to prevent the generation of carrier trapping in the gate insulating film near the drain. Thus, the hot carrier effects can be prevented to increase the reliability and lifetime of the device.

Second, the heavily doped regions are formed below the thick gate oxide film on both sides of the channel region under the gate electrode, thereby solving the problem of the parasitic capacitance generation, which existed in the conventional MOSFET with the LDD region below the thin gate oxide film. In addition, the heavily doped source/drain regions having much more carriers than the lightly doped region are formed on both sides of the channel region under the gate electrode, thereby producing MOSFET devices suitable for the high speed operation.

Third, the doped region of the first conductivity type is formed below the normally doped region of the second conductivity type, thereby effectively preventing punchthrough.

It will be apparent to those skilled in the art that various modifications and variations can be made in the MOSFET and the method of manufacturing the same of the present invention without departing from the spirit or scope of the invention. Thus, it is intended that the present invention cover the modifications and variations of this invention provided they come within the scope of the appended claims and their equivalents.

What is claimed is:

1. A MOSFET comprising:
    a semiconductor substrate of a first conductivity type including a field region and an active region;
    a gate insulating film on a portion of the active region, the gate insulating film having two edge parts and a mid-part, the two edge parts being thicker than the mid-part;
    a gate electrode on the gate insulating film, both the mid-part and the two edge parts of the gate insulating film being completely covered by the gate electrode;
    sidewall spacers on the sides of the gate electrode and the gate insulating film;
    heavily doped regions of a second conductivity type in the semiconductor substrate under the two edge parts of the gate insulating film;
    normally doped regions of the second conductivity type in the semiconductor substrate on both sides of the gate insulating film;
    lightly doped regions of the second conductivity type in the semiconductor substrate on the sides of the sidewall spacers and not underneath the two edge parts of the gate insulating film; and
    doped regions of the first conductivity type below the normally doped region of the second conductivity type under the sidewall spacers.

2. The MOSFET as claimed in claim 1, wherein the two edge parts of the gate insulating film are formed with a tetragonal shape.

3. The MOSFET as claimed in claim 1, wherein the two edge parts of the gate insulating film are formed with a one-quarter round shape.

4. The MOSFET as claimed in claim 1, wherein the gate insulating film is formed of either an oxide or a nitride.

5. The MOSFET as claimed in claim 1, wherein the sidewall spacers are formed of either an oxide or a nitride.

6. The MOSFET as claimed in claim 1, wherein the gate electrode is formed of a material selected from the group consisting of a polysilicon, a silicide and a refractory metal.

7. A MOSFET comprising:
    a semiconductor substrate of a first conductivity type having a field region and an active region;
    a gate insulating film on a portion of the active region, the gate insulating film having two edge parts and a mid-part, the two edge parts being thicker than the mid-part;
    a gate electrode on the gate insulating film;
    sidewall spacers on the sides of the gate electrode and the two edge parts of the gate insulating film;
    doped regions of a second conductivity type in the semiconductor substrate under the two edge parts of the gate insulating film; and
    doped regions of the first conductivity type below the doped regions of the second conductivity type under the sidewall spacers.

8. The MOSFET as claimed in claim 7, wherein the gate insulating film is formed of either an oxide or a nitride.

9. The MOSFET as claimed in claim 7, wherein the sidewall spacers are formed of either an oxide or a nitride.

10. The MOSFET as claimed in claim 7, wherein the gate electrode is formed of a material selected from the group consisting of a polysilicon, a silicide and a refractory metal.

* * * * *